United States Patent
Ju

(10) Patent No.: US 7,313,028 B2
(45) Date of Patent: Dec. 25, 2007

(54) METHOD FOR OPERATING PAGE BUFFER OF NONVOLATILE MEMORY DEVICE

(75) Inventor: Gi Seok Ju, Kyeoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 11/164,714

(22) Filed: Dec. 2, 2005

(65) Prior Publication Data

US 2006/0198188 A1   Sep. 7, 2006

(30) Foreign Application Priority Data

Feb. 17, 2005   (KR) .................... 10-2005-0013029

(51) Int. Cl.
*G11C 16/06* (2006.01)
*G11C 7/10* (2006.01)

(52) U.S. Cl. .................... 365/185.25; 365/189.01; 365/189.05; 365/200; 365/222

(58) Field of Classification Search ............ 365/185.25
See application file for complete search history.

(56) References Cited

U.S. PATENT DOCUMENTS

| | | | | |
|---|---|---|---|---|
| 5,521,865 A * | 5/1996 | Ohuchi et al. | ......... | 365/185.22 |
| 5,936,890 A * | 8/1999 | Yeom | .............. | 365/185.22 |
| 6,671,204 B2 * | 12/2003 | Im | ................. | 365/185.12 |
| 6,717,857 B2 * | 4/2004 | Byeon et al. | ......... | 365/185.21 |
| 6,813,184 B2 * | 11/2004 | Lee | ................. | 365/185.09 |
| 6,826,082 B2 * | 11/2004 | Hwang et al. | ........ | 365/185.17 |
| 6,963,509 B1 * | 11/2005 | Ju | ..................... | 365/189.05 |
| 6,996,014 B2 * | 2/2006 | Lee et al. | ............. | 365/189.05 |
| 7,016,229 B2 * | 3/2006 | Kim | ................. | 365/185.17 |
| 7,061,813 B2 * | 6/2006 | Lee | ................. | 365/189.05 |
| 7,149,130 B2 * | 12/2006 | Lee | ................. | 365/189.05 |
| 2006/0007774 A1 * | 1/2006 | Zanardi et al. | ........ | 365/235 |
| 2006/0039197 A1 * | 2/2006 | Khouri et al. | ........ | 365/185.12 |

FOREIGN PATENT DOCUMENTS

| | | |
|---|---|---|
| JP | 2003-059277 | 2/2003 |
| KR | 0255957 | 2/2000 |
| KR | 10-2003-0033679 | 5/2003 |
| KR | 2003-0088595 | 11/2003 |

* cited by examiner

*Primary Examiner*—Son L. Mai
(74) *Attorney, Agent, or Firm*—Marshall, Gerstein & Borun LLP

(57) ABSTRACT

A method for operating a page buffer of a nonvolatile memory device reduces errors while transferring data between latches and shortens a copy-back programming time. The copy-back program is carried out using one among several latch circuits included in the page buffer. The method activates a first latch circuit while inactivates a second latch circuit, in a copy-back programming operation, and activates the first and second latch circuits in programming, reading, and verifying operations.

14 Claims, 4 Drawing Sheets

METHOD FOR OPERATING PAGE BUFFER OF NONVOLATILE MEMORY DEVICE

TECHNICAL FIELD

This patent relates to methods for operating page buffers in nonvolatile memory devices and more particularly, to a method for operating a page buffer of a NAND flash memory device. The method of the present invention shortens a copy-back programming time.

DISCUSSION OF RELATED ART

There are widely used semiconductor memory devices electrically programmable and erasable with refresh functions for restoring data in predetermined periods. Here, programming means an operation to write data in memory cells.

There has been developed a NAND flash memory device with strings each of which is composed of plural memory cells serially connected for high integration of memory device (i.e., the structure of sharing a drain or source by adjacent memory cells). The NAND flash memory devices are kinds of memory devices those are configured to read out information in sequence, different from NOR flash memory devices.

A NAND flash memory device employs page buffers to store a great deal of data into memory cells or to read out information from the memory cells. The page buffers receive a large amount of data through input/output pads and then provide the data to the memory cells, or output the data after storing the data of the memory cells. While it is usual for the page buffer to be constructed of a single register to temporarily store data, a recent NAND flash memory device employs a dual register for the page buffer so as to raise a programming speed in programming a great deal of data.

The copy-back function may be required when memory cells are defective, transferring data of the defective memory cells to other normal memory cells by way of the page buffers, which assures a reliable use with the data of the defective memory cells.

FIG. 1 is a block diagram showing a copy-back programming operation in a conventional NAND flash memory device.

Referring to FIG. 1, a conventional copy-back programming operation is proceeding along the steps of: reading out a data bit of a defective memory cell of a memory cell array 10 into a first latch circuit 24 of a page buffer 20 (step 1); transferring the data bit from the first latch circuit 24 to a second latch circuit 25 through a copy-back programming circuit 23 (step 2); and reprogramming the data of the second latch circuit 25 in another memory cell (a normal memory cell) (step 3).

However, such a copy-back programming scheme is insufficient in timing margins of the operation because there is high probability of errors while transferring data between the first latch circuit 24 and the second latch circuit 25.

SUMMARY OF THE INVENTION

A method for operating a page buffer in a nonvolatile memory device is capable of shortening a copy-back programming time with transmission errors between latch circuits. The method conducts the copy-back programming operation with a single one among latch circuits belonging to a page buffer.

A method for operating a page buffer of a nonvolatile memory device may include a memory cell array composed of memory cells that are arranged on intersections of wordlines and bitlines, pluralities of the page buffers being connected to the memory cell array through a sensing line and each page buffer having first and second latch circuits. The method may include inactivating the first latch circuit but the second latch circuit in each page buffer during a copy-back programming operation; and activating the first and second latch circuits during programming, reading, and verifying operations.

According to an embodiment, the copy-back programming operation may be carried out by reading a data bit, which has been programmed in a defective memory cell among the memory cells, through a selected bitline among the bitlines and the sensing line and storing the read data bit into the first latch circuit; and transferring a data bit from a first node of the first latch to the selected bitline and reprogramming the data bit into a normal memory cell among the memory cells.

According to an embodiment, reading and storing may include precharging the sensing line during the copy-back programming operation; reading out the data bit of the defective memory cell by way of detecting a precharged or discharged state on the sensing line; and storing the read data bit into the first latch circuit.

According to an embodiment, reprogramming may include transferring the data bit from the first node of the first latch to the selected bitline through the sensing line by a copy-back programming switch connected between the first node of the latch circuit and the sensing line; and reprogramming the transferred data bit into the normal memory cell.

According to an embodiment, programming may include storing a data bit to be programmed, which is transferred from an external source, in one of the first and second latch circuits; inversing the data bit which is to be programmed and stored in said one of the first and second latch circuits; and transferring the inversed data bit to a selected bitline among the bitlines through the sensing line and programming the transferred data bit into the memory cell.

According to an embodiment, reading may include precharging the sensing line; reading a data bit, which has been programmed in the memory cell, through a selected bitline among the bitlines and the sensing line by detecting a precharged or discharged state of the sensing line, and storing the read data bit in one of the first and second latch circuits; inversing the data bit stored in said one of the first and second latch circuits; and reading the inversed data bit out of said one of the first and second latch circuits through a data line.

According to an embodiment, verifying may include precharging the sensing line; detecting a precharged or discharged state of the sensing line and storing a data bit, which has been programmed in the memory cell, into one of the first and second latch circuits; and determining a pass or failed state of the programming operation in response to a voltage level of the data bit stored in said one of the first and second latch circuits.

BRIEF DESCRIPTION OF THE DRAWINGS

The accompanying drawings are included to provide and are incorporated in and constitute a part of this specification. The drawings illustrate example embodiments. In the drawings.

DETAILED DESCRIPTION

Various embodiments will be described below in more detail with reference to the accompanying drawings. These embodiments are provided so that this disclosure will be thorough and complete, and will fully convey the scope of the invention to those skilled in the art. Like numerals refer to like elements throughout the specification.

Figure 1:
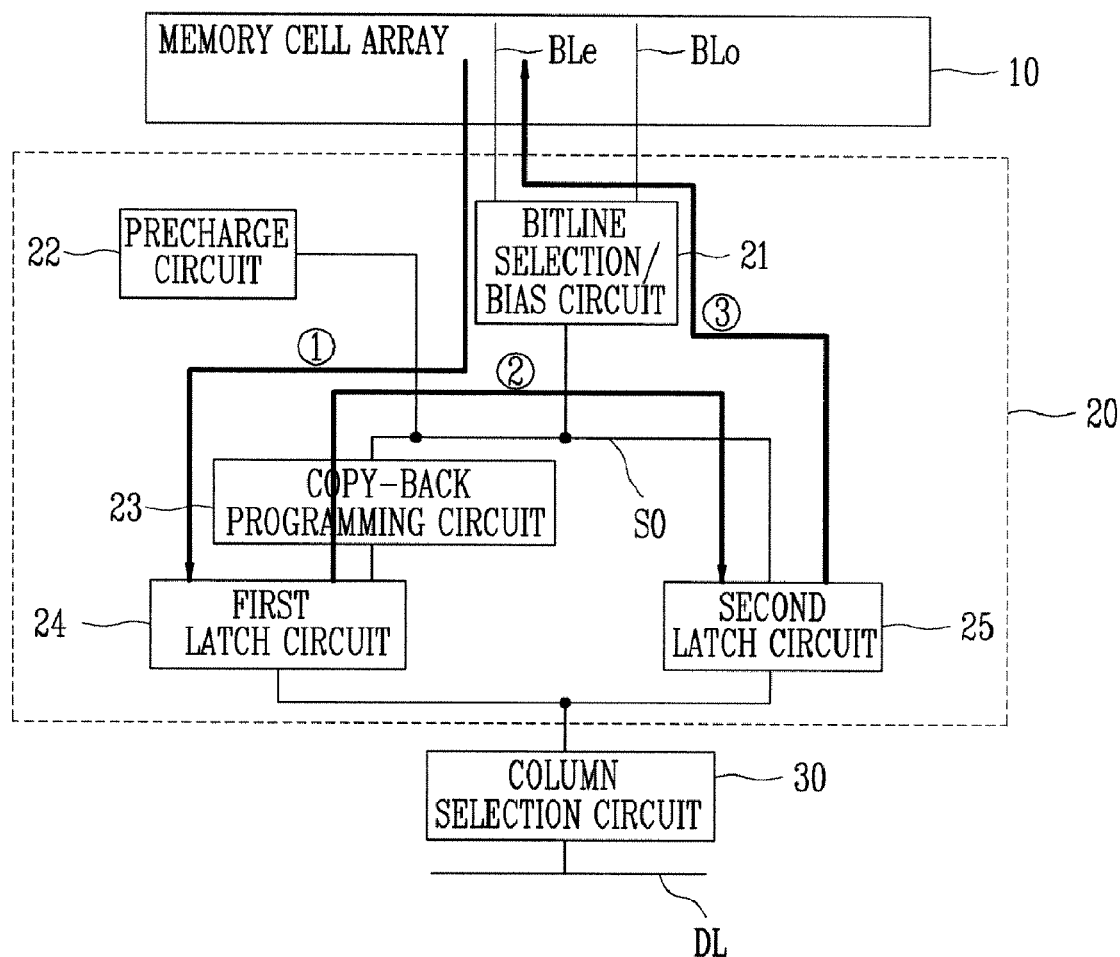
FIG. 1 is a block diagram showing a copy-back programming operation in a conventional NAND flash memory device.
Figure 2:
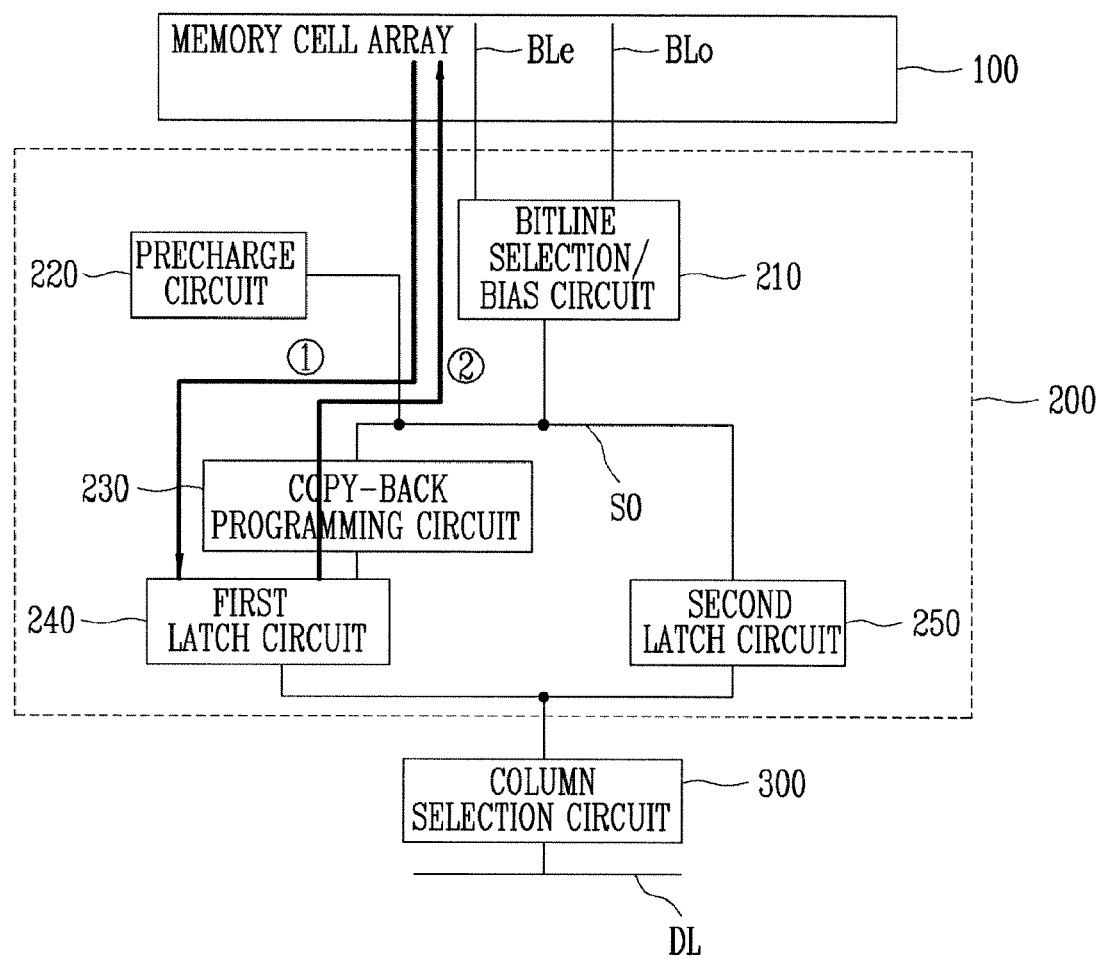
FIG. 2 is a block diagram showing a copy-back programming operation in a NAND flash memory device.

FIG. 2 is a block diagram showing a copy-back programming operation in a NAND flash memory device.

Referring to FIG. 2, the NAND flash memory device is programmed in the sequence of: reading out a data bit from a defective memory cell of a memory cell array 100 through a selected bitline (e.g., BLe) and storing the read-out data bit in a first latch circuit 240 (step 1); and reprogramming the data bit of the first latch circuit 240 into a normal memory cell of the memory cell array 100 by way of a copy-back programming circuit 230 (step 2).

Accordingly, the NAND flash memory device may be programmed just by means of the first latch circuit 240.

Figure 3:
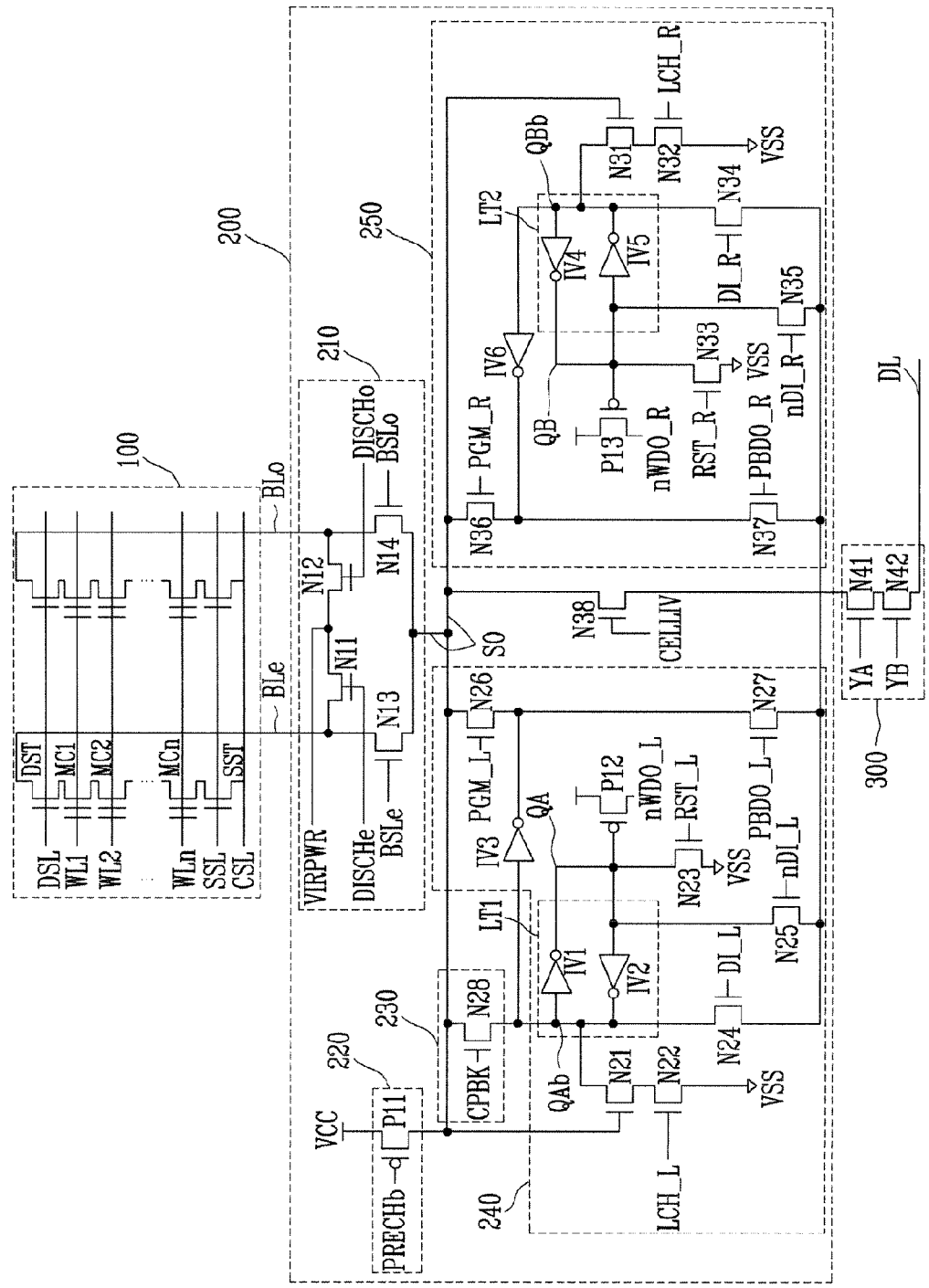
FIG. 3 is a circuit diagram illustrating the NAND flash memory device shown in FIG. 2.

FIG. 3 is a circuit diagram illustrating the NAND flash memory device shown in FIG. 2.

Referring to FIG. 3, the NAND flash memory device may include the memory cell array 100, a page buffer 200, and a column selection circuit 300.

In the memory cell array 100, the reference numeral BLe denotes even-ordered bitlines while the reference numeral BLe denotes odd-ordered bitlines. Pluralities of memory cells MC1~MCn are connected to the even-ordered bitlines BLe, while other memory cells are connected to the odd-ordered bitlines BLo. A memory cell (e.g., M1) is controlled by a single wordline (e.g., WL), belonging to a single page.

The page buffer 200 is connected between the memory cell array 100 and the column selection circuit 300, and the bitlines BLe and BLo are connected to the page buffer 200 through a sensing line SO. While the page buffer 200 is arranged in plurality, FIG. 3 illustrates the single one in convenience of description.

The page buffer 200 may include a bitline selection circuit 210, a precharging circuit 220, the copy-back programming circuit 230, the first latch circuit 240, and a second latch circuit 250.

The bitline selection circuit 210 may include NMOS transistors N11~N14. The NMOS transistor N11 is connected between the bitline BLe and a line supplying a voltage supply signal VIRPWR. The NMOS transistor N11 is turned on, or off in response to a gate control signal DISCHe that is applied to a gate thereof. The NMOS transistor N11 is turned on in response to the gate control signal DISCHe, applying a power source voltage VCC to the bitline BLe as the voltage supply signal VIRPWR, when a data bit is to be programmed in the bitline BLo. The NMOS transistor N12 is connected between the bitline BLo and the line supplying the voltage supply signal VIRPWR. The NMOS transistor N12 is turned on, or off in response to a gate control signal DISCHo that is applied to a gate thereof.

The NMOS transistor N12 is turned on in response to the gate control signal DISCHo, applying the power source voltage VCC to the bitline BLo as the voltage supply signal VIRPWR, when a data bit is to be programmed in the bitline BLe. The voltage supply signal VIRPWR is set on the level of the power source voltage VCC in the programming operation. The NMOS transistor N13 connects the bitline BLe to the sensing line SO in response to a bitline selection signal BSLe, while the NMOS transistor N14 connects the bitline BLo to the sensing line SO in response to a bitline selection signal BSLo.

The precharging circuit 220 is connected between the power source voltage VCC and the sensing line SO. The precharging circuit 220 may include a PMOS transistor P11 that is turned on, off in response to a precharge signal PRECHb applied to a gate thereof. The PMOS transistor P11 precharges the sensing line SO up to the power source voltage VCC in the reading operation, making the bitline BLe or BLo supplied with a current through the sensing line SO.

The copy-back programming circuit 230 is connected between the sensing line SO and the first latch circuit 240. The copy-back programming circuit 230 may include an NMOS transistor N28 that is turned on, off in response to a copy-back signal CPBK applied to a gate thereof. The NMOS transistor N28 connects the first latch circuit 240 to the sensing line SO, in order to reprogram a data bit of a defective memory cell, which is stored in the first latch circuit 240, into a normal cell in the copy-back programming operation.

The first latch circuit 240 may include NMOS transistors N21~N27, a main latch LT1, a PMOS transistor P12, and an inverter IV3. The main latch LT1 may include inverters IV1 and IV2, temporarily storing a data bit read out from a memory cell. The NMOS transistor N21 is turned on or off in response to a signal on the sensing line SO, while the NMOS transistor N22 is turned on or off in response to a main latch signal LCH_L. The NMOS transistor N22 is turned on along as the NMOS transistor N21 is turned on, changing a node QAb of the main latch LT1 to '0' while a node QA of the main latch LT1 to '1'. The NMOS transistor N23 is connected between the node QA of the main latch LT1 and a ground voltage VSS, initializing the node QA of the main latch LT1 to '0' while the node QAb to '1' in response to a reset signal RST_L applied to a gate thereof. The inverter IV3 outputs an inverse signal from a signal of the node QAb of the main latch LT1. The NMOS transistors, N24 and N25, are turned on in response each to data input signals DI and nDI only in the programming operation, storing a data bit, which is to be programmed and transferred from the external through a data line DL, into the main latch LT1. The NMOS transistor N26 is turned on in response to a program signal PGM_L only in the programming operation, transferring a data bit to be programmed, i.e., the output signal of the inverter IV3, to a selected bitline BLe or BLo through the sensing line SO. The NMOS transistor N27 is turned on in response to a read signal PBDO_L only in the read operation, transferring a data bit from the selected bitline, i.e, a signal from the node QA of the main latch LT1, to the data line DL through the column selection circuit 300. The PMOS transistor P12 is provided to confirm a programmed result, verifying pass or fail of the programming operation by reading the signal from the node QA of the main latch LT1.

The second latch circuit 250 may include NMOS transistors N31~N37, a cache latch LT2, a PMOS transistor P13, and an inverter IV6. The circuit components of the second latch circuit 250 are as same as those of the first latch circuit 250 in operation, so it would be rather refer to the operations of the first latch 240 aforementioned.

The column selection circuit 300 may include two NMOS transistors N41 and N42 controlled by column selection signals YA and YB. The NMOS transistors, N41 and N42, function to connect the page buffer 200 to the data line DL in the reading and programming operations. The column selection signals, YA and YB, are generated from a column address.

As aforementioned, the first and second latch circuits, 240 and 250, are all operable with selectivity in the programming, reading, and verifying operations. For instance, if the first latch circuit 240 is activated to conduct the programming, reading, and verifying operations, the second latch circuit 250 becomes inactivated. Otherwise, if the second latch circuit 250 is activated to conduct the programming, reading, and verifying operations, the first latch circuit 240 becomes inactivated.

Figure 4:
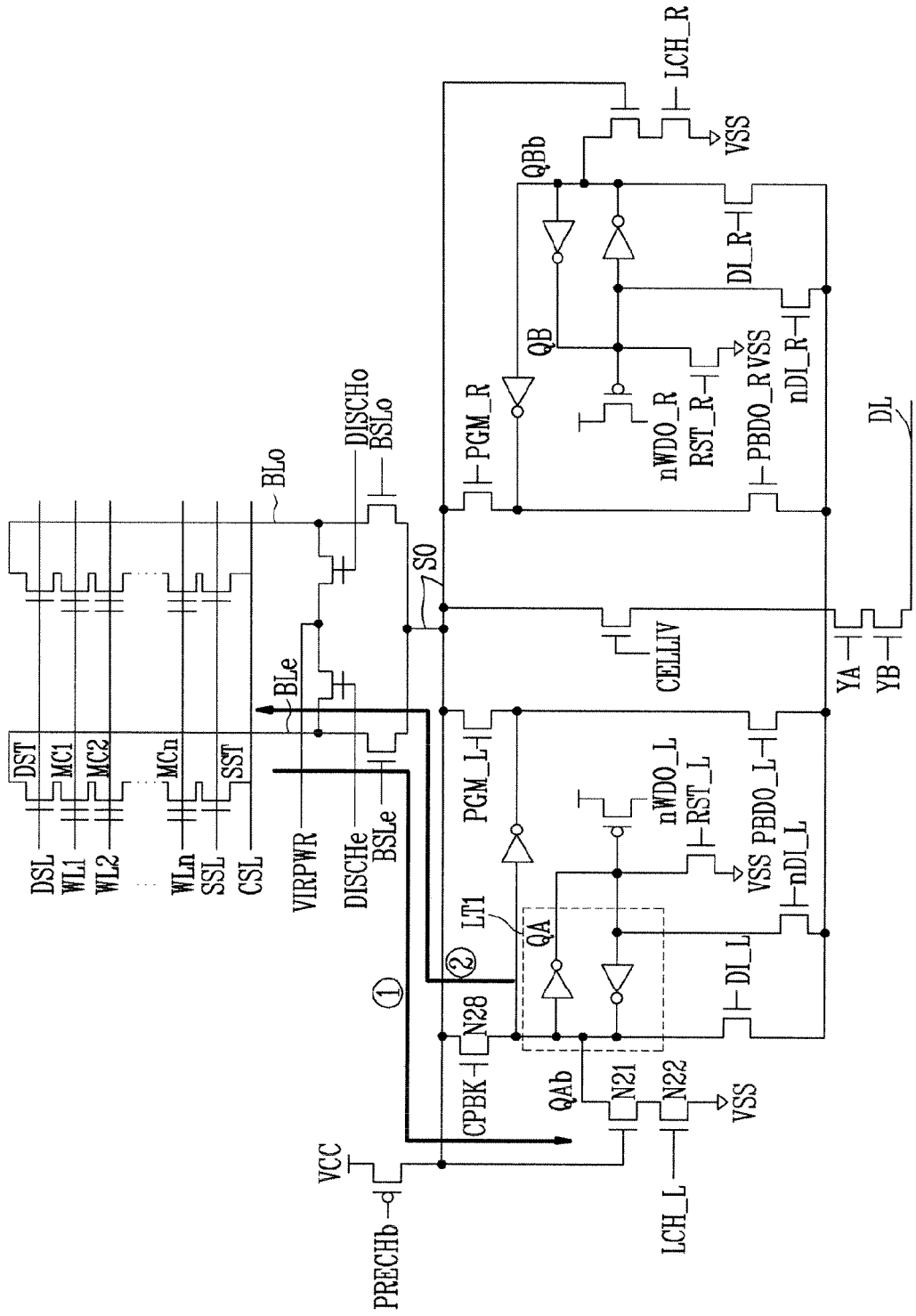
FIG. 4 is a circuit diagram showing a copy-back programming operation in the NAND flash memory device shown FIG. 3.

FIG. 4 is a circuit diagram showing the copy-back programming

Hereinafter, it will be described about the copy-back programming operation, assuming that a defective memory cell is MC1, by which a data bit of the defective memory cell MC1 is read into the first latch circuit 240 and then reprogrammed into a normal memory cell, with reference to FIG. 4.

First, it is required of selecting a wordline WL1 and a bitline BLe in reading out a data bit from the memory cell MC1 and reprogramming it into another normal memory cell. After then, the node QA of the main latch LT1 is initialized into '0' while the node QAb of the main latch LT1 is initialized into '1'. And, the sensing line SO is precharged on the level of the power source voltage VCC. During this, if a current flowing through the sensing line SO is discharged, the memory cell MC1 is determined as an erased cell. But, if a current flowing through the sensing line SO is not changed to maintain the precharged state, the memory cell MC1 is determined as a programmed cell.

As the defective memory cell MC1 is a programmed cell, the sensing line SO maintains the precharged state with the power source voltage VCC. Then, the NMOS transistors N21 and N22 are turned on, so that the node QAb of the main latch LT1 is set on '0' and the node QA of the main latch LT1 is changed to '1' (step 1). Thus, as the NMOS transistor N28 is turned on in response to the copy-back signal CPBK, the signal '0' is transferred to the bitline BLe from the node QAb of the main latch LT1 and thereby the data bit of the memory cell MC1 is reprogrammed into a memory cell MC2 (step 2).

As aforementioned, it is possible to prosecute the copy-back programming operation just with using the main latch LT1 without the cache latch LT2.

It is also possible to reprogram a data bit from a defective memory cell into a normal memory cell directly through a bitline without through a cache latch, which raises a speed of the copy-back programming operation.

Although the various embodiments have been described, it will be apparent to those skilled in the art that various substitution, modifications and changes may be thereto without departing from the scope and spirit of the invention.

What is claimed as new and desired to be protected by Letters Patent of the United States is:

1. A method for operating a page buffer of a nonvolatile memory device including a memory cell array composed of memory cells that are arranged on intersections of wordlines and bitlines, pluralities of the page buffers being connected to the memory cell array through a sensing line and each page buffer having first and second latch circuits and a copy-back programming switch, the method comprising:

activating the first latch circuit and inactivating the second latch circuit in the page buffer and transferring a data stored in a first node of the first latch circuit into the sensing line through the copy-back programming switch connected between the first node of the first latch circuit and the sensing line during a copy-back programming operation; and activating the first and second latch circuits during programing, reading, and verifying operations, wherein verifying comprises precharging the sensing line, detecting a precharged or discharged state of the sensing line and storing a data bit, which has been programmed in the memory cell, into one of the first and second latch circuits, and determining a pass or failed state of the programming operation in response to a voltage level of the data bit stored in said one of the first and second latch circuits.

2. The method as set forth in claim 1, wherein the copy-back programming operation is carried out by:

reading a data bit, which has been programmed in a defective memory cell among the memory cells, through a selected bitline among the bitlines and the sensing line and storing the read data bit into the first latch circuit; and transferring a data bit from the first node of the first latch circuit to the selected bitline and reprogramming the data bit into a normal memory cell among the memory cells.

3. The method as set forth in claim 2, wherein reading and storing comprises:

precharging the sensing line during the copy-back programming operation;

reading out the data bit of the defective memory cell by way of detecting a precharged or discharged state on the sensing line; and storing the read data bit into the first latch circuit.

4. The method as set forth in claim 2, wherein reprogramming comprises:

transferring the data bit from the first node of the first latch circuit to the selected bitline through the sensing line by the copy-back programming switch connected between the first node of the first latch circuit and the sensing line; and reprogramming the transferred data bit into the normal memory cell.

5. The method as set forth in claim 1, wherein programming comprises:

storing a data bit to be programmed, which is transferred from an external source, in one of the first and second latch circuits;

inversing the data bit which is to be programmed and stored in said one of the first and second latch circuits; and transferring the inversed data bit to a selected bitline among the bitlines through the sensing line and programming the transferred data bit into the memory cell.

6. The method as set forth in claim 1, wherein reading comprises:

precharging the sensing line;

reading a data bit, which has been programmed in the memory cell, through a selected bitline among the bitlines and the sensing line by detecting a precharged or discharged state of the sensing line, and storing the read data bit in one of the first and second latch circuits;

inversing the data bit stored in said one of the first and second latch circuits; and reading the inversed data bit out of said one of the first and second latch circuits through a data line.

7. A page buffer of a nonvolatile memory device including a memory cell array composed of memory cells that are arranged on intersections of wordlines and bitlines, pluralities of the page buffers being connected to the memory cell array through a sensing line, the page buffer comprising:

a bitline selection circuit connecting between the memory cell array and the sensing line and selecting one of the bitlines according to control signals;

a precharging circuit connecting between a power source voltage and the sensing line and precharging the sensing line up to the power source voltage in response to a precharge signal and precharging the selected bitline with the power source voltage through the sensing line;

a first latch circuit connecting between the sensing line and a data line and activating during a copy-back programming, programming, reading, and verifying operations;

a second latch circuit connecting between the sensing line and the data line and activating during programming, reading, and verifying operations;

a copy-back programming switch connecting between a first node of the first latch circuit and the sensing line and reprogramming a memory cell in response to a copy-back signal in the copy-back programming operation to transfer a data stored in the first node of the first latch circuit to the sensing line wherein the verifying operation comprises storing a data bit programmed in a memory cell in response to a precharged or discharged state of the sensing line into one of the first and second latch circuits, and determining a pass or failed state of the copy-back programming operation in response to a voltage level of the data bit stored in said one of the first and second latch circuits.

8. The device as set forth in claim 7, wherein the copy-back programming switch includes an NMOS transistor being operated in response to the copy-back signal.

9. A method for operating a page buffer of a nonvolatile memory device including a memory cell array composed of memory cells that are arranged on intersections of wordlines and bitlines, pluralities of the page buffers being connected to the memory cell array through a sensing line and each page buffer having first and second latch circuits, the method comprising:

transferring a data stored in a first cell on the first latch;

transferring the data stored in the first latch through a switch controlled by copy-back signal to a second cell during a copy-back programming operation; and activating the first and second latch circuits during programming, reading, and verifying operations, wherein verifying comprising precharging the sensing line, detecting a precharged or discharged state of the sensing line and storing a data bit, which has been programmed in the memory cell, into one of the first and second latch circuits, and determining a pass or failed state of the programming operation in response to a voltage level of the data bit stored in said one of the first and second latch circuits.

10. The method as set forth in claim 9, wherein the copy-back programming operation is carried out by:

reading a data bit, which has been programmed in a defective memory cell among the memory cells, through a selected bitline among the bitlines and the sensing line and storing the read data bit into the first latch circuit, and transferring a data bit from a first node of the first latch circuit to the selected bitline and reprogramming the data bit Into a normal memory cell among the memory cells.

11. The method as set forth in claim 10, wherein reading and storing comprises:

precharging the sensing line during the copy-back programming operation;

reading out the data bit of the defective memory cell by way of detecting a precharged or discharged state on the sensing line; and storing the read data bit into the first latch circuit.

12. The method as set forth in claim 10, wherein reprogramming comprises:

transferring the data bit from the first node of the first latch circuit to the selected bitline through the sensing line by a copy-back programming switch connected between the first node of the first latch circuit and the sensing line; and reprogramming the transferred data bit into the normal memory cell.

13. The method as set forth in claim 9, wherein programming comprises:

storing a data bit to be programmed, which is transferred from an external source, in one of the first and second latch circuits;

inversing the data bit which is to be programmed and stored in said one of the first and second latch circuits; and transferring the inversed data bit to a selected bitline among the bitlines through the sensing line and programming the transferred data bit into the memory cell.

14. The method as set forth in claim 9, wherein reading comprises:

precharging the sensing line;

reading a data bit, which has been programmed in the memory cell, through a selected bitline among the bitlines and the sensing line by detecting a precharged or discharged state of the sensing line, and storing the read data bit in one of the first and second latch circuits;

inversing the data bit stored in said one of the first and second latch circuits; and reading the inversed data bit out of said one of the first and second latch circuits through a data line.

* * * * *